United States Patent
Mclean, Jr. et al.

(10) Patent No.: US 10,155,477 B1
(45) Date of Patent: Dec. 18, 2018

(54) VEHICLE LIGHT DETECTOR DEVICE (VLDD)

(71) Applicants: James Edward Mclean, Jr., Charlotte, NC (US); Edward D. Mclean, Lockhart, TX (US)

(72) Inventors: James Edward Mclean, Jr., Charlotte, NC (US); Edward D. Mclean, Lockhart, TX (US)

(73) Assignee: Mcleanics Technology Corporation, Charlotte, NC (US)

( * ) Notice: Subject to any disclaimer, the term of this patent is extended or adjusted under 35 U.S.C. 154(b) by 0 days.

(21) Appl. No.: 15/731,904

(22) Filed: Aug. 21, 2017

(51) Int. Cl.
*B60Q 11/00* (2006.01)
*G01R 31/00* (2006.01)
*G01R 31/04* (2006.01)
*G01R 19/165* (2006.01)
(Continued)

(52) U.S. Cl.
CPC .......... *B60Q 11/005* (2013.01); *G01R 19/165* (2013.01); *G01R 31/007* (2013.01);
(Continued)

(58) Field of Classification Search
CPC ................ B60Q 11/005; G01R 19/165; H05B 33/0881; G10R 31/007; G10R 31/045
(Continued)

(56) References Cited

U.S. PATENT DOCUMENTS

2005/0057179 A1* 3/2005 Madhani .................. B60Q 1/30
315/185 R
2014/0313027 A1* 10/2014 Johnson ............... B60Q 11/005
340/458
(Continued)

Primary Examiner — Ojiako K Nwugo

(57) ABSTRACT

The Vehicle Light Detector Device (VLDD), is a device that senses or detects when a vehicle's light(s), lamp(s), or indicating light(s) has failed, burnt out, or not working properly. Said vehicle light(s), lamp(s), or indicating light(s) includes, but is not limited to, the vehicle's head light(s), brake light(s), turn signal light(s), tag light(s), or any combination thereof, including a third brake light. A single light, lamp, or indicating light may be sensed, detected, or monitored for failure; or multiple lights, lamps, or indicating lights may be sensed, detected, or monitored for failure. The VLDD may be installed or incorporated within a vehicle that includes, but is not limited to cars, trucks, buses, boats, SUV's, motor homes (RV's), trains, airplanes, or any other vehicles used for transportation. As of today, we have vehicle sensors that warns or alerts us when a door is ajar, our keys are left in the ignition, our seat belt is not properly secured, when our engine needs checked, when our oil needs changed, etc. But, none of todays current automobile sensor technology will sense or detect, and warn or alert us when our vehicle's light(s), lamp(s), or indicating light(s) have failed or is not properly working. Thus, the driver of the vehicle may be exposed to a rear end collision in the event that the vehicle's brake lights fail; or the driver of the vehicle may be exposed to receiving a citation from a law enforcement officer in the event of said brake light failure. In either case, the driver of the vehicle will be exposed to hardships because insurance premiums may increase due to the accident or citation, lost of income due to having to make a court appearance to resolve the citation, or even medical expenses due to the accident. However, these and other hardships related to failed vehicle light(s), lamp(s), or indicating light(s) can be avoided if the VLDD is incorporated or installed within the vehicle. Another example is, a boat traveling at night on a river, and one of the boat's indicating lights (i.e. the starboard light) has burnt out. Other boats traveling at night would have a difficult time determining the traveling direction of the boat with the burnt out indicating light; therefore, a risk of collision would exist and could take place, and people could be exposed to injury or even death. Indicating lights play a great part and are extremely impor-
(Continued)

tant on boats navigating at night. Every day an accident occurs due to failed or burnt out vehicle light(s), lamp(s), or indicating light(s); and some of these accidents results in death or serious injury to a person. Also, countless of rear-end collisions have left many people with permanent neck or back injuries. And, many of these rear-end collisions were due to failed brake lights or indicating lights (i.e. turning signals). The VLDD can help to prevent such a tragedy from occurring.

15 Claims, 3 Drawing Sheets

(51) Int. Cl.
  *G01R 31/44* (2006.01)
  *H05B 33/08* (2006.01)
(52) U.S. Cl.
  CPC .......... *G01R 31/045* (2013.01); *G01R 31/44* (2013.01); *H05B 33/089* (2013.01)
(58) Field of Classification Search
  USPC ........................................................ 340/458
  See application file for complete search history.

(56) References Cited

U.S. PATENT DOCUMENTS

2016/0379350 A1* 12/2016 Matsui .................... B60Q 1/44
                                                              348/125
2017/0106791 A1*  4/2017 Li ........................ G01C 21/3697

* cited by examiner

VEHICLE LIGHT DETECTOR DEVICE (VLDD)

CROSS REFERENCE TO RELATED APPLICATION

This Application is related to the Vehicle Light Detector Device, Provisional Patent Application, Application No. 62/494,818; filed on Aug. 23, 2016.

STATEMENT REGARDING FEDERAL SPONSORED RESEARCH

None Applicable.

REFERENCE TO SEQUENCE LISTING, TABLE, OR A COMPUTER PROGRAM LISTING COMPACT DISC APPENDIX

None Applicable.

BACKGROUND OF INVENTION

The Vehicle Light Detector Device (VLDD), is in the field of automobile sensor. As of today, the current automobile sensors will sense things such as when our door is ajar, our keys are left in the ignition, our seat belts are not properly secured, when our engine needs checked, when our oil needs changed, etc. However, none of todays current automobile sensor technology will sense or detect and warn or alert us when our vehicle's light(s), lamp(s), or indicating light(s) have failed or is not properly working. The VLDD will solve this problem.

BRIEF SUMMARY OF INVENTION

The Vehicle Light Detector Device (VLDD), is a device that senses or detects when a vehicle's light(s), lamp(s), or indicating light(s) has failed, burnt out, or not working properly. Said vehicle light(s), lamp(s), or indicating light(s) includes, but is not limited to, the vehicle's head light(s), brake light(s), turn signal light(s), tag light(s), or any combination thereof, including a third brake light. A single light, lamp, or indicating light may be sensed, detected, or monitored for failure; or multiple lights, lamps, or indicating lights may be sensed, detected, or monitored for failure.

DETAIL DESCRIPTION OF THE INVENTION

Figure 1:
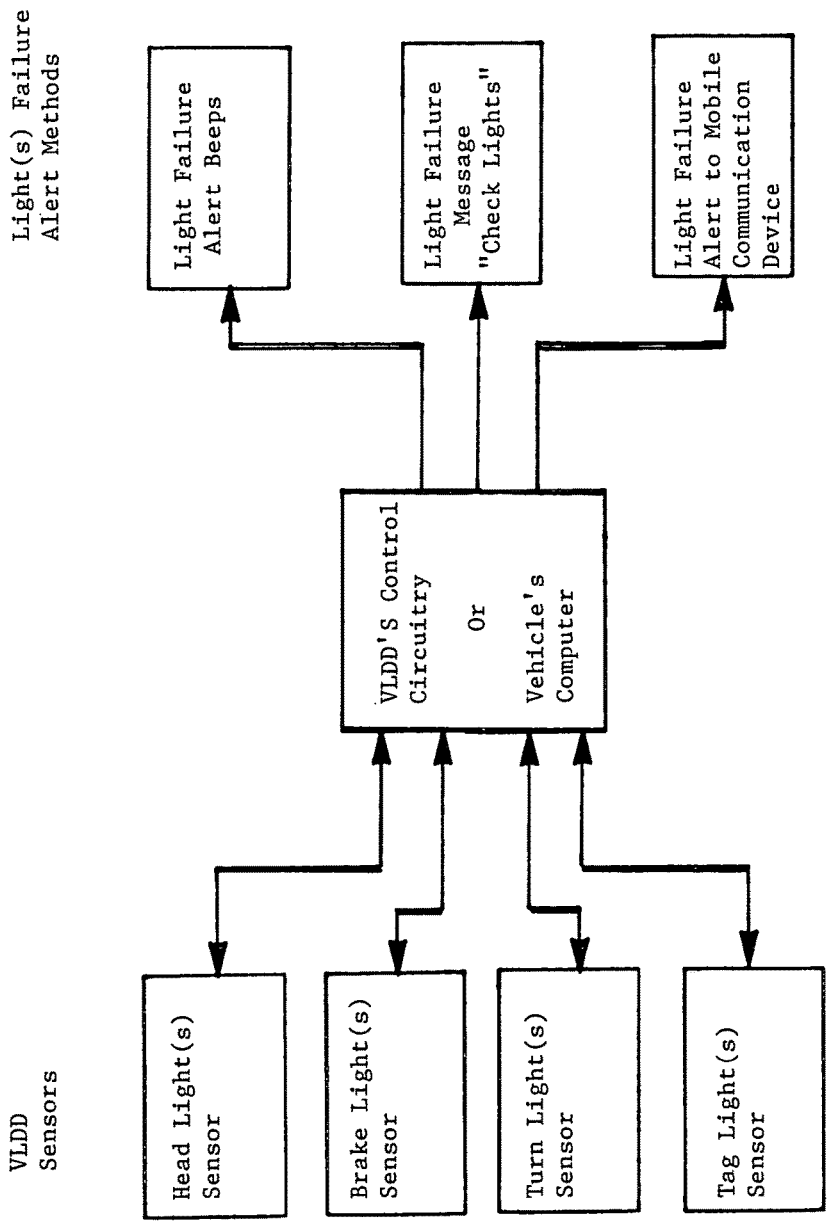
FIG. 1, is the Block Diagram view of the Invention. In this figure, a few examples of the VLDD sensors are shown to be attached to the vehicle's head lights, brake lights, turn lights (i.e. turning signals), and tag lights, other sensors attached to other vehicle lights may exist, but or not shown in this figure. As shown in the figure, the VLDD sensors are attached to the VLDD control circuitry or the vehicle's computer. This arrangement enables the VLDD sensors to transmit a signal (i.e. a failed light, burnt out light, etc.) to the VLDD control circuitry or the vehicle's computer. The signal transmission can be bidirectional, which permit the VLDD control circuitry or the vehicle's computer to communicate back to the sensors in the event that the VLDD sensor is a smart sensor, or is capable of receiving communication signals. Once the VLDD control circuitry or the vehicle's computer receives a signal from the VLDD sensors, an alert of a failed or burnt out light will be given to the driver of the vehicle. Said alerting means may be sound beeps, a visual message such as, "Check lights", or an alert transmitted to a mobile or remote communication device such as a smart phone, cell phone, tablet, laptop, etc. Further, other alerting means may be employed such as, but not limited to, voice speech sound, internal flashing lights, etc. The VLDD sensors can be an electrical, electronic, or mechanical device or component, which may have means of connectivity to the vehicle's lights via hard wire, wireless connectivity means (i.e. Blue Tooth, WiFi, etc.), or a proximity connectivity means such as, a photo cell, opticoupler, etc. If the VLDD sensor is a photo cell, it will sense or detect a failed or burnt out vehicle light by proximity to its illumination; in other words, if the light does not illuminate when activated, then the VLDD (photo cell) sensor will not produce a voltage or current flow signal. This zero voltage or zero current flow signal is then interpreted by the VLDD control circuitry or the vehicle's computer to mean that a light has failed or is burnt out. A positive or negative coefficient photo cell can be used; therefore, the photo cell signal can be either a positive, negative, or zero voltage or current, and the VLDD circuitry or the vehicle's computer can interpret these signals to mean a failed or burnt out light.
Figure 2:
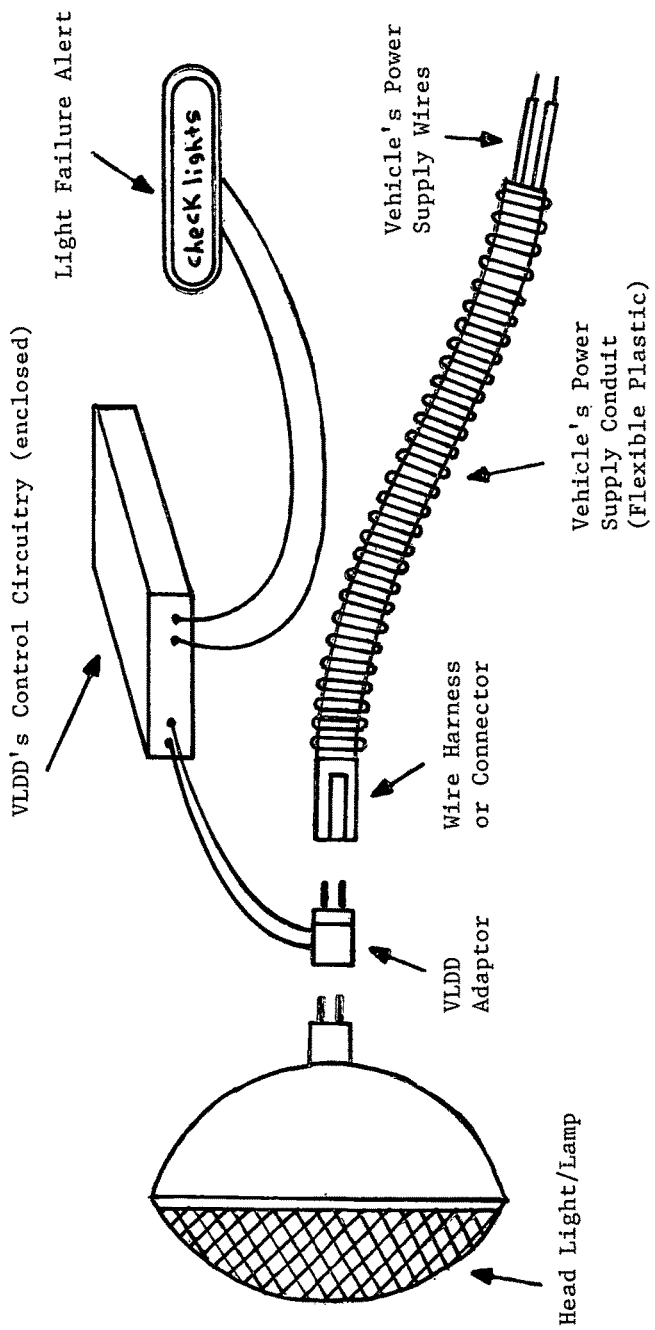
FIG. 2, is the 3D view of the Invention. In this figure, it depicts a simply VLDD sensor that is in the form of an adaptor type connector. This VLDD sensor can be installed within or connected to the vehicle's actual electrical circuitry (wires) that supplies power to the light(s). This VLDD sensor type is wired in series with the light. Once wired in series, the VLDD sensor will detect or sense the current flow through the light when activated. If the light is activated (i.e. supplied voltage) and there is no current flow through the light, the VLDD sensor will transmit a signal to the VLDD control circuitry or the vehicle's computer, which in turn will trigger an alert to the driver of the vehicle (e.g. a check lights message). The VLDD sensor can be wired in parallel with the light as well; however, a parallel configuration is not depicted in this figure.
Figure 3:
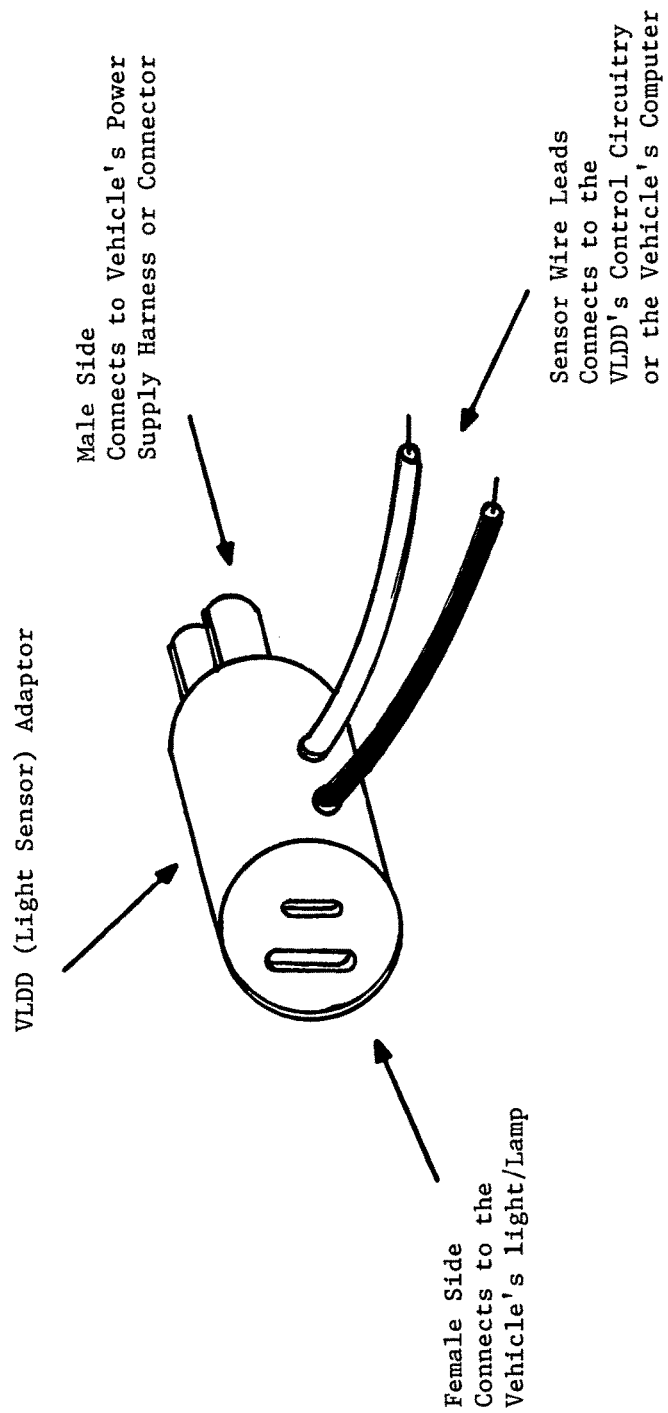
FIG. 3, is the 3D adaptor view of the Invention. This figure depicts the VLDD sensor as an adaptor, which enables the vehicle's power supply wire harness or connector means that connects to the light to be connected directly to the VLDD sensor instead. Then, the VLDD sensor can be connected directly to the actual light. This arrangement enables the VLDD sensor to be wired in series with the light.

The Vehicle Light Detector Device (VLDD), is a device that senses or detects when a vehicle's light(s), lamp(s), or indicating light(s) has failed, burnt out, or not working properly. Said vehicle light(s), lamp(s), or indicating light(s) includes, but is not limited to, the vehicle's head light(s), brake light(s), turn signal light(s), tag light(s), or any combination thereof, including a third brake light. A single light, lamp, or indicating light may be sensed, detected, or monitored for failure; or multiple lights, lamps, or indicating lights may be sensed, detected, or monitored for failure.

The term vehicle may include, but is not limited to cars, trucks, buses, boats, SUV's, motor homes (RV's), trains, airplanes, or any other vehicles used for transportation.

The VLDD may be, but is not limited to, an electronic device or circuit, a sensor, a computer installed or incorporated within a vehicle that contains a software program or app used to detect or sense a failed or burnt out vehicle light, an electrical device, or any combination thereof.

Said vehicle lights may include, but is not limited to, turn signal light(s), tag light(s), brake light(s), headlight(s), and any other exterior lights, lamp(s), or indicating light(s), and shall hereinafter be referred to as light(s).

When the driver of the vehicle activates the vehicle's light(s), by pressing the brake paddle, or turning on a turn signal, or turning on the headlight(s), etc., the VLDD will sense or detect any failed or burnt out light(s). This is accomplished by a sensor of some type placed or wired in series or parallel with the light(s). The sensor will either sense the current draw through the light(s), or the voltage drop or rise across the light(s). This current or voltage provides a signal to the VLDD circuitry, which may be electrical, solid state electronics, or microprocessor based. The VLDD will process the signal, and based on the value or magnitude of the current or voltage signal, the VLDD circuitry will make a determination as to whether or not the light(s) have failed or burnt out. Once the VLDD circuitry has made a determination that a light has failed or burnt out, the VLDD circuitry will alert the driver of the vehicle regarding the failed or burnt out light(s).

The VLDD may use the vehicle's computer as its control circuitry.

The VLDD may use other sensor means to sense, detect, or monitor the vehicle's light(s) such as, but not limited to, a shunt resistor, photo cell, thermal sensor, etc. And, the VLDD may be an adaptor type device, which is placed between the light(s) and its power supply harness or connector.

The VLDD's alerting means may be, but is not limited to, an internal flashing light, buzzer, tone or beep, voice speech, message, text, or any other alerting means.

The VLDD may also transmit an alert of a failed or burnt out light(s) to a mobile or remote communication device via a wireless means or protocol such as, but not limited to, BlueTooth, WiFi, etc.

Said mobile or remote communication device may be, but is not limited to a cell phone, smart phone, tablet, laptop, computer, etc.

The VLDD may be a sensor or similar device that is incorporated or embedded within a light, lamp, bulb, light holder, lamp holder, fixture, or any combination thereof that is designed to be installed or incorporated within a vehicle, and for sensing, detecting, or monitoring of the vehicle's light(s), to determine if said light(s) has failed or burnt out.

The VLDD may be integrated or embedded within the vehicle's computer; or linked to the vehicle's computer by wire or wireless means or protocol such as, Bluetooth or WiFi. Therefore, the VLDD will provide a sensing, monitoring, or detection signal of a failed or burnt out light(s) to the vehicle's computer; therefore, enabling the vehicle's computer to process the signal and alert the driver of the vehicle, by some alerting means, that a light(s) has failed or burnt out.

As of today, we have vehicle sensors that warns or alert us when a door is ajar, our keys are left in the ignition, our seat belt is not properly secured, when our engine needs checked, when our oil needs changed, etc. But, none of todays current automobile sensor technology will sense or detect, and warn or alert us when our vehicle's light(s), lamp(s), or indicating light(s) have failed or is not properly working. Thus, the driver of the vehicle may be exposed to a rear end collision in the event that the vehicle's brake lights fail; or the driver of the vehicle may be exposed to receiving a citation from a law enforcement officer in the event of said brake light failure. In either case, the driver of the vehicle will be exposed to hardships because insurance premiums may increase due to the accident or citation, lost of income due to having to make a court appearance to resolve the citation, or even medical expenses due to the accident. However, these and other hardships related to failed vehicle light(s), lamp(s), or indicating light(s) can be avoided if the VLDD is incorporated or installed within the vehicle. Another example is, a boat traveling at night on a river, and one of the boat's indicating lights (i.e. the starboard light) has burnt out. Other boats traveling at night would have a difficult time determining the traveling direction of the boat with the burnt out indicating light; therefore, a risk of collision would exist and could take place, and people could be exposed to injury or even death. Indicating lights play a great part and are extremely important on boats navigating at night. Every day an accident occurs due to failed or burnt out vehicle light(s), lamp(s), or indicating light(s); and some of these accidents results in death or serious injury to a person. Also, countless of rear-end collisions have left many people with permanent neck or back injuries. And, many of these rear-end collisions were due to failed brake lights or indicating lights (i.e. turning signals). The VLDD can help to prevent such a tragedy from occurring.

We claim:

1. A device that senses, detects, or monitors a vehicle's external lights, and alerts or warns of a failed, burnt out, or improperly working vehicle light, comprising:
    (a) a smart sensor that is programmed with software, and said sensor has a connectivity circuit, a hard wire connectivity means for connecting to a control circuit, a wireless proximity connectivity means, a wireless protocol, and can receive communication signals;
    (b) a control circuit that can interpret a voltage or current flow signal, which determines that a zero voltage or zero current is indicative of a failed or burnt out light;
    (c) an adaptor type connector for connecting in series or parallel within the vehicle's electrical circuit that supplies power to the light.

2. The device, as outlined in claim number 1, wherein said vehicle's external light is a brake light, turn signal light, headlight, tag light, indicating light, or any combination thereof, including a third brake light.

3. The device, as outlined in claim number 1, wherein said vehicle is a car, truck, bus, SUV, motor home, RV, train, airplane, or a vehicle used for transportation.

4. The device, as outlined in claim number 1, wherein said device is an electrical device, electronics device, mechanical device, or component.

5. The device, as outlined in claim number 1, wherein said device is a circuit or microprocessor.

6. The device, as outlined in claim number 1, wherein said device is a computer installed or incorporated within a vehicle, and said computer contains a software program or app used to instruct said functions of claim number 1.

7. The device, as outlined in claim number 1, wherein said device is a sensor installed or incorporated within a vehicle for the purposes of providing the functions as outlined in claim number 1.

8. The device, as outlined in claim number 1, wherein said device is a sensor or similar device, integrated, installed, incorporated, or embedded within a vehicle's light, lamp, light holder, lamp holder, light fixture, bulb, on any combination thereof.

9. The device, as outlined in claim number 1, wherein said device attaches to a control circuit, or uses the vehicle's computer as its control circuit.

10. The device, as outlined in claim number 1, wherein said device is a sensor, and said sensor is a shunt resistor, photo cell, thermal sensor, opticoupler, or a component used to sense or detect a failed or burnt out vehicle light, or to monitor such conditions.

11. The device, as outlined in claim number 1, wherein said device is an adaptor, which is connected or installed between the vehicle's light and power supply harness or connector; or said device, as outlined in claim number 1, has a connectivity means to connect to the vehicle's light via hard wire, wireless protocol, or proximity means.

12. The device, as outlined in claim number 1, wherein said device has an alerting means, and said alerting means is an internal flashing light, buzzer, tone or beep, voice speech, message, text, or sound device.

13. The device, as outlined in claim number 1, wherein said device transmits an alert of a failed or burnt out vehicle light to a smart phone, cell phone, tablet, laptop, computer, mobile or remote communication device via a wireless protocol.

14. The device, as outlined in claim number 1, wherein said device links to the vehicle's computer by wire, or via a wireless protocol, or is embedded within said vehicle's computer.

15. The device, as outlined in claim number 1, wherein said device is a sensor, and said sensor can bidirectionally communicate with the control circuit or vehicle's computer.

\* \* \* \* \*